(12) United States Patent
Uno et al.

(10) Patent No.: US 7,946,022 B2
(45) Date of Patent: May 24, 2011

(54) COPPER ALLOY FOR ELECTRONIC MACHINERY AND TOOLS AND METHOD OF PRODUCING THE SAME

(75) Inventors: Takeo Uno, Tokyo (JP); Chikahito Sugahara, Tokyo (JP); Kuniteru Mihara, Tokyo (JP)

(73) Assignee: The Furukawa Electric Co., Ltd., Tokyo (JP)

(*) Notice: Subject to any disclaimer, the term of this patent is extended or adjusted under 35 U.S.C. 154(b) by 220 days.

(21) Appl. No.: 11/478,292

(22) Filed: Jun. 30, 2006

(65) Prior Publication Data

US 2007/0015001 A1 Jan. 18, 2007

(30) Foreign Application Priority Data

Jul. 5, 2005 (JP) ................................. 2005-195720

(51) Int. Cl.
*C22F 1/08* (2006.01)
*B21B 15/00* (2006.01)
*B22D 27/20* (2006.01)

(52) U.S. Cl. ...... 29/527.7; 29/592.1; 148/536; 148/554; 428/612; 428/674; 428/675

(58) Field of Classification Search ................. None
See application file for complete search history.

(56) References Cited

U.S. PATENT DOCUMENTS 5,261,154 A * 11/1993 Ferrier et al. ................ 29/830
5,328,561 A * 7/1994 Letize et al. ................ 216/13

FOREIGN PATENT DOCUMENTS

| JP | 63-096232 | 4/1988 |
| JP | 63-118051 | 5/1988 |
| JP | 63-230884 | 9/1988 |
| JP | 63-266050 | 11/1988 |
| JP | 2-100355 | 4/1990 |
| JP | 3-215688 | 9/1991 |
| JP | 8-319527 | 12/1996 |
| JP | 8-319528 | 12/1996 |
| JP | 9-111500 | 4/1997 |
| JP | 10-102166 | 4/1998 |
| JP | 10-265973 | 10/1998 |
| JP | 11-29894 | 2/1999 |
| JP | 2001-49369 | 2/2001 |
| JP | 2003-89832 | 3/2003 |

OTHER PUBLICATIONS

Japanese Office Action dated Jul. 1, 2008, issued in corresponding Japanese Patent Application No. 200-184940.
Shiga, A. et al; "Analysis on Electroplatability of Copper and Copper Alloys in Relation to their Surface Characterization"; Journal of the Japan Copper and Brass Research Association, Japan, Oct. 1, 1982, vol. 21, pp. 64-76.
International Search Report dated Aug. 8, 2006 of PCT/JP2006/313305.

* cited by examiner

*Primary Examiner* — Jennifer C McNeil
*Assistant Examiner* — Jason L Savage
(74) *Attorney, Agent, or Firm* — Westerman, Hattori, Daniels & Adrian, LLP

(57) ABSTRACT

A copper alloy for electronic machinery and tools, having a surface layer of a work affected layer whose thickness is 0.2 μm or below; and a method of producing the same.

6 Claims, 1 Drawing Sheet

COPPER ALLOY FOR ELECTRONIC MACHINERY AND TOOLS AND METHOD OF PRODUCING THE SAME

TECHNICAL FIELD

The present invention relates to a copper alloy improved in platability with metals.

BACKGROUND ART

Copper alloys used in electronic machinery and tools are given various kinds of metal plating, seeking to impart more functionality thereto. In their use for lead frames, for example, they are given Ag plating for wire bonding, Cu plating as a foundation for the said Ag plating, and solder plating for mounting on boards.

Recent years have also seen the use of plated lead frames prepared by giving metal plating throughout the surface of lead frames after forming lead by etching or presswork. The metal plating given therein includes Pd plating, and Ni plating as a foundation thereof.

In recent years, further increases in packing density and further reductions in size and profile have been required of electronic components used in electronic machinery and tools. In response to these requirements, efforts have been moving ahead to increase the number of pins and to narrow pitches in the fields of lead frames, terminals, and connectors. From the viewpoint of environmental issues, the solder used in mounting those components on boards has been required to be free of lead, and then many lead-free solders bring about a rise in soldering temperatures at the time of mounting on boards.

As pitches are narrowed, problems may be caused in the producing method of lead frames. Specifically, there may be cases in which the Ag plating given in the producing method of lead frames causes anomalous precipitation and growth to a projecting form, thereby lowering the bonding strength of wire bonding, and shorts may occur between adjacent leads.

In addition, the Cu plating as a foundation is exposed in areas to which Ag plating is not given, and when it is heated in a packaging process, an oxidation film on the lead frame surface is formed. In these areas also, anomalous precipitation, for example, porous precipitation, of the Cu plating causes formation of oxide film inferior in adhesiveness on the lead frame surface, to result in lowering of adhesion between a mold resin and lead frames. Thus, the problem occurs that, when soldering onto boards is carried out, packages become cracked in a reflowing furnace.

Seeking to resolve those these problems, the method of limiting the number of precipites in a copper alloy, which form starting points of anomalous precipitation of plating, to a certain value or below, and the method of limiting the contents of addition elements or impurity elements to certain values or below, have been proposed. However, these methods, though effective on copper alloys having specific alloy compositions, cannot be applied to other copper alloys. Under the circumstances, methods applicable to the entire copper alloys have not yet been found.

Additionally, although methods of improving the influences of the work affected layer present on the surface of a metallic material have so far been proposed, they aim to improve adhesiveness and solder wettability of the metal-plated layer, and differ in substance from the present invention based on the finding of the relationship between the anomalous precipitation of metal plating (e.g. projecting precipitation, porous precipitation) and the thickness of the work affected layer.

DISCLOSURE OF INVENTION

In accordance with the present invention, a copper alloy having an excellent platability with metals and causing neither anomalous precipitation of plating metals nor lowering of adhesiveness of oxidation film can be provided for use in electronic machinery and tools.

As a result of our intensive studies on the problem caused during or after metal plating, it has been found that a work affected layer constituted of a Beilby layer (upper layer) having an amorphous structure and a microcrystalline layer (lower layer) having very fine crystalline aggregate texture was present in the surface layer of a copper alloy for use in electronic machinery and tools, which was manufactured in a general process where various steps, such as casting, hot rolling, cold rolling, buff polishing and annealing, were combined as appropriate, and when metal plating was given on this work affected layer, there occurred the problem-causing anomalous precipitation of metal plating. And further studies have been proceeding, thereby achieving the present invention.

Copper alloys are generally produced by using appropriate combinations of steps, such as casting, hot rolling, cold rolling, buff polishing and annealing, and undergo various types of plastic working in the process of production. As a result of the plastic working, a work affected layer and a plastic deformation layer, showing finer crystalline structure than those in the bulk copper alloy (or inner part of the copper alloy), are formed in the copper alloy surface layer.

In the present invention, "work affected layer" refers to a non-uniform microcrystalline structure (for example, amorphous, or the grain size of less than 0.2 μm) which is formed in the surface layer of a copper alloy underlying various types of plastic deformation processing as stated above, and is constituted of a Beilby layer (upper layer) and a microcrystalline layer (lower layer). The Beilby layer has an amorphous structure, while the microcrystalline layer has a very fine crystalline aggregate texture. The plastic deformation layer has a crystalline aggregate texture that the crystal grains therein is coarser than those in the microcrystalline layer and their sizes (for example, from about 0.2 to 3.0 μm) approach gradually sizes of crystal grains in the bulk copper alloy (or inner part of the copper alloy) (for example, from about 3.0 to 10.0 μm).

According to our finding, when a nonuniform microcrystalline structure as in the case of the work affected layer is present in the copper alloy surface, there is a tendency to cause such anomalous precipitation that nuclear growth progresses preferentially from some nuclei formed at the initial stage of plating and develop into projection formation, and that the plating layer become porous because uniform nucleation is hard to occur on the aforesaid surface layer. The present invention has been made based on these findings.

According to the present invention, there are provided the following means:
(1) A copper alloy for electronic machinery and tools, having a surface layer comprising a work affected layer whose thickness is 0.2 μm or below;
(2) The copper alloy for electronic machinery and tools according to the above item (1), which is plated with metal;
(3) The copper alloy for electronic machinery and tools according to the above item (1) or (2), which is plated with Ag or Cu;

(4) The copper alloy for electronic machinery and tools according to any one of the above items (1) to (3), comprising 0.05 to 0.5% by mass of Cr, 0.05 to 2.0% by mass of Sn and 0.05 to 1.0% by mass of Zn, and further comprising, optionally, 0.01 to 0.5% by mass in a total amount of at least one selected from the group consisting of 0.01 to 0.5% by mass of Si and 0.01 to 0.5% by mass of Zr, with the balance being Cu and inevitable impurities;

(5) The copper alloy for electronic machinery and tools according to any one of the above items (1) to (3), comprising 2.0 to 4.0% by mass of Ni and 0.4 to 0.8% by mass of Si, and further comprising, optionally, 0.005 to 2.0% by mass in a total amount of at least one selected from the group consisting 0.05 to 0.15% by mass of Mg, 0.005 to 0.1% by mass of Ag, 0.005 to 0.1% by mass of Mn, 0.05 to 2.0% by mass of Sn and 0.05 to 1.0% by mass of Zn, with the balance being Cu and inevitable impurities;

(6) A lead frame using the copper alloy for electronic machinery and tools according to any one of the above items (1) to (5);

(7) A terminal using the copper alloy for electronic machinery and tools according to any one of the above items (1) to (5);

(8) A connector using the copper alloy for electronic machinery and tools according to any one of the above items (1) to (5);

(9) A method of producing a copper alloy for electronic machinery and tools, comprising removing a work affected layer forming a surface layer of the copper alloy to adjust a thickness of the work affected layer to 0.2 µm or below;

(10) The method of producing a copper alloy for electronic machinery and tools according to the above item (9), wherein the removing a work affected layer is performed by chemical dissolving treatment;

(11) The method of producing a copper alloy for electronic machinery and tools according to the above item (9), wherein the removing a work affected layer is performed by electrochemical dissolving treatment;

(12) The method of producing a copper alloy for electronic machinery and tools according to the above item (9), wherein the removing a work affected layer is performed by heat treatment;

(13) The method of producing a copper alloy for electronic machinery and tools according to any one of the above items (9) to (12), wherein the copper alloy comprises 0.05 to 0.5% by mass of Cr, 0.05 to 2.0% by mass of Sn and 0.05 to 1.0% by mass of Zn, and further comprises, optionally, 0.01 to 0.5% by mass in a total amount of at least one selected from the group consisting of 0.01 to 0.5% by mass of Si and 0.01 to 0.5% by mass of Zr, with the balance being Cu and inevitable impurities; and

(14) The method of producing a copper alloy for electronic machinery and tools according to any one of the above items (9) to (12), wherein the copper alloy comprises 2.0 to 4.0% by mass of Ni and 0.4 to 0.8% by mass of Si, and further comprises, optionally, 0.005 to 2.0% by mass in a total amount of at least one selected from the group consisting 0.05 to 0.15% by mass of Mg, 0.005 to 0.1% by mass of Ag, 0.005 to 0.1% by mass of Mn, 0.05 to 2.0% by mass of Sn and 0.05 to 1.0% by mass of Zn, with the balance being Cu and inevitable impurities.

The present copper alloy for electronic machinery and tools is a copper alloy having in its surface layer a nonuniform and fine work affected layer controlled so as to have a thickness of 0.2 µm or below by removing treatment. By the thus controlled work affected layer being given metal plating, anomalous precipitation can be prevented and the platability of the copper alloy, including Ag plating and Cu plating which exerts an influence upon adhesion of oxidation film, is improved.

The present invention provides an improvement in the platability of a copper alloy by reducing the thickness of a work affected layer present in the copper alloy surface layer to 0.2 µm or below, and exerts its effect on various types of copper alloys differing in alloy composition and property. In addition, the present invention can also ensure prevention of anomalous precipitation in solder plating, Ni plating or else as in the cases of Ag plating and Cu plating, thereby offering an excellent platability.

Lead frames, terminals and connectors using the present copper alloy for electronic machinery and tools have satisfactory yields because the troubles ascribable to the platability of a copper alloy don't occur in their respective producing methods, and ensure high reliability in not only packaging and onboard-mounting processes but also at the use stage subsequent thereto.

Other and further features and advantages of the invention will appear more fully from the following description, taken in connection with the accompanying drawings.

BEST MODE FOR CARRYING OUT THE INVENTION

Figure 1:
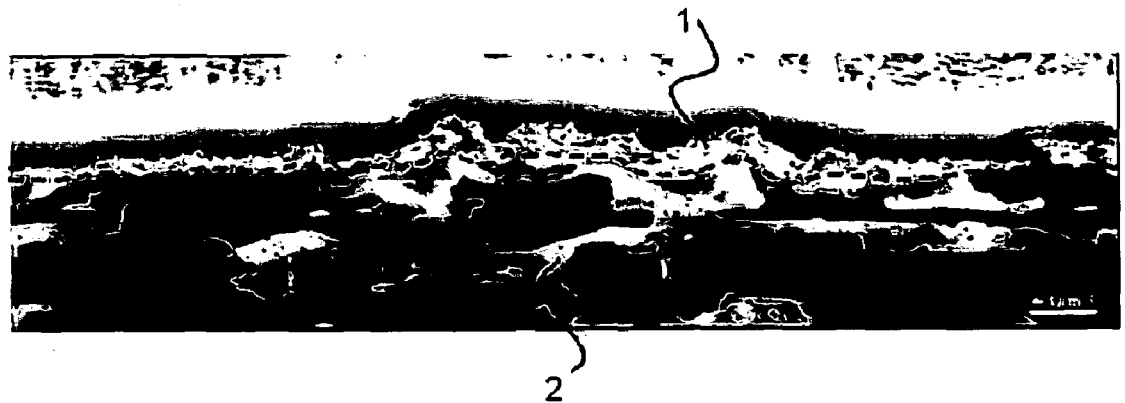
FIG. 1 is a cross-sectional photograph of a copper alloy under SIM observation.

Hereinafter, the present invention will be described in detail.

In order to avoid anomalous precipitation in metal plating and ensure an excellent platability of a copper alloy, the present invention requires that the work affected layer has a thickness reduced to the limit of no effect on crystallinity under precipitation of the metal plating. Specifically, it is preferable that the thickness be adjusted to 0.2 µm or below. For uses requiring high reliability in particular, it is more preferable to adjust the thickness of the work affected layer to 0.05 µm or below.

Examples of metal plating which can be given to the copper alloy of the present invention include Ag plating, Cu plating, solder plating, Sn plating and Ni plating. The present invention is especially preferable for application to Ag plating or Cu plating given to copper alloys for uses in such as lead frames, terminals and connectors.

Examples of a copper alloy usable as the copper alloy of the present invention include not only Cu—Sn-series and Cu—Zn-series alloys of solid-solution type but also Cu—Cr—Sn-series, Cu—Cr-series, Cu—Ni—Si-series, Cu—Fe—P-series and Cu—Ni—Sn-series copper alloys of precipitate type. Among these alloys, those especially suitable for application of the present invention are Cu—Cr—Sn-series and Cu—Ni—Si-series copper alloys used for multi-pin lead frames with narrow lead pitches.

In order that the Cu—Cr—Sn-series copper alloy can have strength and electric conductivity satisfactory as lead frames, it is preferable that the chemical composition thereof is within the following range.

Chromium (Cr) is an addition element causing precipitation in copper and thereby enhancing strength of the copper alloy. When Cr is added in a too small amount, it has little effect on the strength enhancement; while, when the amount is too large, the effect of Cr addition reaches a level of saturation. Therefore, the preferable range in the present invention is from 0.05 to 0.5% by mass. In this range, the range of 0.1 to 0.45% by mass is more preferable, and the range of 0.2 to 0.4% by mass is far more preferable.

Tin (Sn) and zinc (Zn) are addition elements forming solid solutions in copper, and providing solid-solution reinforcement and further having the effect of remarkably increasing the strength in the subsequent cold working. The addition of these elements in a small amount produces little effect, while their addition in a large amount impairs electric conductivity. In order to ensure electric conductivity desirable to electronic machinery and tools, the Sn content is preferably 0.05 to 2.0% by mass, and the Zn content is preferably 0.05 to 1.0% by mass. The Sn content is more preferably from 0.1 to 0.5% by mass, far more preferably from 0.2 to 0.4% by mass, and the Zn content is more preferably from 0.1 to 0.5% by mass, far more preferably from 0.15 to 0.3% by mass.

For further enhancement of strength, either silicon (Si), or zirconium (Zr), or both may be added to the Cu—Cr—Sn-series copper alloy.

The Si is an addition element forming a Cr—Si precipitate in combination with Cr, and enhancing copper alloy strength by complex precipitation of Cr and Cr—Si. The addition of Si in a too small amount produces little effect, while its addition in a too large amount impairs electric conductivity. In the present invention, the Si content is preferably adjusted to the range of 0.01 to 0.5% by mass, more preferably 0.05 to 0.4% by mass, far more preferably 0.1 to 0.3% by mass.

Zr is an addition element causing precipitation in copper and thereby enhancing copper alloy strength. The addition of Zr in a too small amount produces little effect, while the effect of Zr addition reaches saturation when the amount of Zr is too large. In the present invention, the Zr content is preferably adjusted to the range of 0.01 to 0.5% by mass, more preferably 0.05 to 0.4% by mass, far more preferably 0.1 to 0.3% by mass.

The total amount of Si content and Zr content is preferably in a range of 0.01 to 0.5% by mass.

In order that the Cu—Ni—Si-series copper alloy can have strength and electric conductivity satisfactory as lead frames, it is preferable that the chemical composition thereof is within the following range.

Ni and Si are addition elements forming a Ni—Si precipitate by control of the addition ratio between Ni and Si, and providing precipitation reinforcement to increase the copper alloy strength. When the Ni content is too small, sufficient precipitation reinforcement cannot be achieved; while, when the Ni content is too large, the electric conductivity is impaired. In the present invention, the Ni content is preferably from 2.0 to 4.5% by mass, more preferably from 2.0 to 4.0% by mass, far more preferably from 2.5 to 4.0% by mass.

The degree of reinforcement becomes the maximum when the addition amount of Si is about one-fifth the addition amount of Ni. Accordingly, the Si content is preferably adjusted to a range of 0.25 to 1.0% by mass, more preferably 0.4 to 0.9% by mass, far more preferably 0.4 to 0.8% by mass, especially far more preferably 0.5 to 0.8% by mass.

In order to further enhance characteristics, Mg, Ag, Mn, Sn and Zn may be added to the Cu—Ni—Si series copper alloy.

Magnesium (Mg) is an addition element increasing copper alloy strength by forming a solid solution or causing precipitation in copper. The addition of Mg in a too small amount has little effect, and that in a too large amount lowers hot workability of ingot. The Mg content is preferably from 0.05 to 0.3% by mass, more preferably from 0.05 to 0.15% by mass, furthermore preferably from 0.1 to 0.2% by mass, especially preferably from 0.13 to 0.17% by mass.

Silver (Ag) is an addition element increasing copper alloy strength by forming a solid solution in copper. The addition of Ag in a too small amount produces little effect, while that in a too large amount saturates the effect of Ag addition, and causes a rise in cost. Therefore, the Ag content is preferably 0.005 to 0.2% by mass, more preferably 0.005 to 0.1% by mass, further preferably 0.01 to 0.1% by mass, and far more preferably 0.02 to 0.05% by mass.

Manganese (Mn) is an addition element improving hot workability of ingot. The addition of Mn in a too small amount produces little effect, while that in a too large amount impairs electric conductivity. The Mn content is preferably 0.005 to 0.2% by mass, more preferably 0.005 to 0.1% by mass, further preferably 0.01 to 0.15% by mass, far more preferably 0.07 to 0.12% by mass.

Sn and Zn are elements forming solid solutions in copper, and providing solid-solution reinforcement and further having the effect of remarkably increasing the strength in the subsequent cold working. The addition of these elements in a too small amount produces little effect, while their addition in a too large amount impairs electric conductivity of the copper alloy. In order to ensure electric conductivity desirable to electronic machinery and tools, the Sn content is preferably limited to 0.05 to 2.0% by mass or below, and the Zn content is preferably limited to 0.05 to 1.0% by mass. The Sn content is more preferably from 0.05 to 1.0% by mass, far more preferably from 0.1 to 0.2% by mass, and the Zn content is more preferably from 0.1 to 0.7% by mass.

The total amount of contents of Ag, Mg, Mn, Sn, Zn is preferably in a range of 0.005 to 2.0% by mass.

In the present invention, methods of removal by chemical dissolving treatment, electrochemical dissolving treatment and physical treatment such as sputtering can be applied in removing the work affected layer of the copper alloy. Alternatively, it is also possible to apply a method of repairing crystallinity of the amorphous or microcrystalline structure by heat treatment in the non-oxidizing atmosphere so that the work affected layer comes to have the same crystalline structure as in the plastic deformation layer or in the inner part (or bulk) of the copper alloy, and to disappear. In the case of physical treatment such as sputtering, there are restrictions as to the size applicable therein and the treatment time. So the method of removal by chemical or electrochemical dissolving treatment or heat treatment is suitable as an industrial method.

In the chemical dissolving treatment, it is possible to use an acid solution containing a combination of acid and oxidizer. In the combination, sulfuric acid, nitric acid, hydrochloric acid, hydrofluoric acid or phosphoric acid can be used as the acid, and hydrogen peroxide, chromate or persulfate can be used as the oxidizer. Among these combinations, the combination of sulfuric acid and hydrogen peroxide is preferred over the others from the viewpoint of the dissolution speed, consideration for the environmental aspect and workability.

For the electrochemical dissolving treatment, anodic electrolysis in an acidic solution can be utilized, wherein an electrolytic solution prepared by adding an inorganic acid like chromic acid to phosphoric acid or sulfuric acid is applicable. Electrolytic solutions containing phosphoric acid are suitable for the copper alloys because of their proven track record and excellent polishing effect.

As the heat treatment, heating in a reducing- or inert-atmosphere furnace can be utilized. More specifically, batch heating in an annealing furnace or continuous heating in a continuous annealing furnace is applicable so long as the heating temperature and the heating time are appropriately combined. In order to prevent surface oxidation of copper alloy during the removal treatment, the heating in a reducing atmosphere, such as the atmosphere of hydrogen, is advisable. So the batch heating in such as a bell-type furnace is suitable from the viewpoint of stability for oxygen concentration during the heat treatment.

An inspection of the work affected layer of the present copper alloy is made by the profile of the surface layer of the copper alloy being observed under magnification. In order to make a clear distinction between structures, it is advantageous for the structures to be observed in a state that they are magnified about 10,000 times with an electron microscope, and the use of such an observation device as SIM or FE-SEM is especially favorable. Further, it is preferable to adopt in section work a method of forming no work affected layer, so such an apparatus as FIB can be used to particular advantage.

Figure 2:
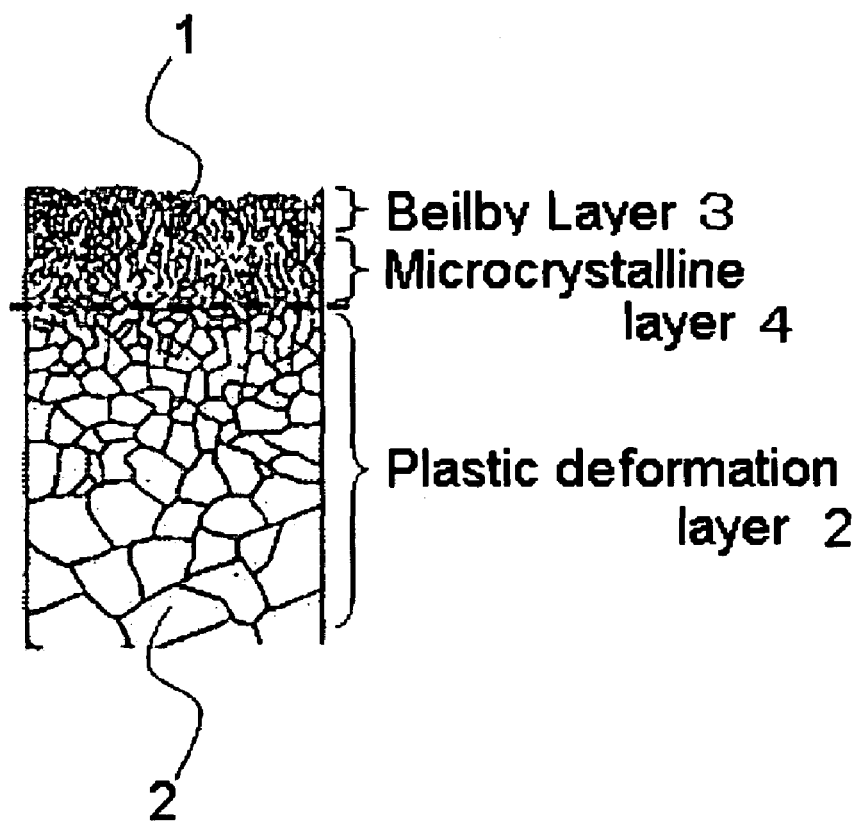
FIG. 2 is a schematic diagram depicting a cross-section of a copper alloy comprising a work affected layer 1 and a plastic deformation layer 2.

Using FIGS. 1 and 2, the cross-sectional structure of the copper alloy is explained.

FIG. 1 is a cross-sectional photograph of a copper alloy under SIM observation.

FIG. 2 is a schematic diagram depicting a cross-section of a copper alloy comprising a work affected layer 1 and a plastic deformation layer 2.

As is apparent from the FIG. 2, the work affected layer 1 is made up of a Beilby layer 3 (upper layer) and a microcrystalline layer 4 (lower layer). The Beilby layer 3 has an amorphous texture, and the microcrystalline layer 4 has a very fine crystalline aggregate texture. The plastic deformation layer 2 present underneath the work affected layer 1 is coarser in crystal grains than the microcrystalline layer and, as shown in FIG. 1, the work affected layer 1 (the area enclosed with a broken line) is clearly different in crystalline structure from the plastic deformation layer 2. So these two layers are readily distinguishable.

The work affected layer varies in the amount formed according to the degree of processing, so there are cases in which the thickness thereof varies within the field of view or in comparison among different observation spots when it is observed under magnification by microscope observation. Therefore, a thickness of the work affected layer is measured at its thickest position within the field of observation under magnification, and the mean of thickness values measured at 5 different observation spots is defined as the thickness of the work affected layer.

The present invention will be described in more detail based on the following examples, but the invention is not intended to be limited thereto.

EXAMPLES

Example 1

Copper alloys having chemical compositions shown in Table 1 were made into 0.15-mm thick copper alloy sheets by undergoing casting, rolling, buff polishing and annealing in succession. These copper alloy sheets were each given degreasing treatment and pickling treatment, and then subjected to treatment for removal of their respective work affected layers by chemical dissolution. Each of the thus treated materials was coated with Ag plating, and Ag platability was evaluated.

TABLE 1

| Alloy No. | Alloy composition (mass %) | | | | | | | | | | |
|---|---|---|---|---|---|---|---|---|---|---|---|
| | Cr | Sn | Zn | Ni | Si | Mg | Fe | P | Ag | Mn | Cu |
| A | 0.3 | 0.25 | 0.2 | | | | | | | | Balance |
| B | | | | 3.0 | 0.65 | 0.15 | | | | | Balance |
| C | | | 0.15 | | | | 2.3 | 0.03 | | | Balance |
| D | | 0.15 | | | | | | | | | Balance |
| E | | 0.5 | | 2.5 | 0.6 | | | | 0.03 | 0.1 | Balance |

The degreasing treatment was performed by cathodic electrolysis for 30 seconds in a degreasing solution, which contained 60 g/l of Cleaner 160S (trade name, produced by Meltex Inc.) and was kept at a temperature of 60° C., under a current density of 2.5 A/d m$^2$. And the pickling treatment was performed at room temperature by immersion for 30 seconds in an acid pickling solution containing 100 g/l of sulfuric acid.

Each of the work affected layers underwent removal treatment by immersion in an aqueous solution containing 100 g/l of sulfuric acid and 15 g/l of hydrogen peroxide at room temperature. Herein, five specimens of each copper alloy were prepared for examples of the present invention so that their individual work affected layers after the removal treatment had different thicknesses of 0, 0.02, 0.05, 0.1 and 0.2 μm, respectively; while one specimen of each copper alloy was prepared for a comparative example so that its work affected layer after the removal treatment had the thickness of 0.3 μm.

The Ag plating was performed at room temperature in an Ag plating bath containing 55 g/l of silver potassium cyanide, 75 g/l of potassium cyanide, 10 g/l of potassium hydroxide and 25 g/l of potassium carbonate under a current density of 1.0 A/dm$^2$ until the plating thickness reached 3 μm.

As to the Ag platability of each copper alloy specimen, the Ag-plated surface of each specimen was observed under a microscope of 450 magnifications (made by Keyence Corporation), and the number of projecting anomalous precipitates formed on the Ag-plated surface was counted. The condition of each Ag-plated surface was rated as "⊚" when the number of anomalous precipitates per unit area was smaller than 5 per mm$^2$, it was rated as "○" when the number was from 5 to 10 per mm$^2$, and it was rated as "×" when the number was greater than 10 per mm$^2$.

Evaluation results in Example 1 are shown in Table 2.

TABLE 2

| Remarks | Alloy No. | Thickness of work affected layer (μm) | Evaluation of Ag platability |
|---|---|---|---|
| This invention | A | 0 | ⊚ |
| | | 0.02 | ⊚ |
| | | 0.05 | ⊚ |
| | | 0.1 | ○ |
| | | 0.2 | ○ |
| | B | 0 | ⊚ |
| | | 0.02 | ⊚ |
| | | 0.05 | ⊚ |

TABLE 2-continued

| Remarks | Alloy No. | Thickness of work affected layer (μm) | Evaluation of Ag platability |
|---|---|---|---|
| | | 0.1 | ○ |
| | | 0.2 | ○ |
| | C | 0 | ◎ |
| | | 0.02 | ◎ |
| | | 0.05 | ◎ |
| | | 0.1 | ○ |
| | | 0.2 | ○ |
| | D | 0 | ◎ |
| | | 0.02 | ◎ |
| | | 0.05 | ◎ |
| | | 0.1 | ○ |
| | | 0.2 | ○ |
| | E | 0 | ◎ |
| | | 0.02 | ◎ |
| | | 0.05 | ◎ |
| | | 0.1 | ○ |
| | | 0.2 | ○ |
| Comparative example | A | 0.3 | X |
| | B | 0.3 | X |
| | C | 0.3 | X |
| | D | 0.3 | x |
| | E | 0.3 | X |

Example 2

Ag plating was performed in the same manner as in Example 1, except that electrolytic dissolution was used as the method of removing the work affected layer of each copper alloy, and the Ag platability was evaluated using the same criteria as in Example 1.

The removal of the work affected layer of each copper alloy was performed by anodic electrolysis in an aqueous solution containing 700 g/l of phosphoric acid at room temperature under a current density of 10 A/dm$^2$. Herein, five specimens of each copper alloy were prepared for examples of the present invention so that their individual work affected layers after the removal treatment had thicknesses of 0, 0.02, 0.05, 0.1 and 0.2 μm, respectively; while one specimen of each copper alloy was prepared for a comparative example so that its work affected layer after the removal treatment had the thickness of 0.3 μm.

Evaluation results in Example 2 are shown in Table 3.

TABLE 3

| Remarks | Alloy No. | Thickness of work affected layer (μm) | Evaluation of Ag platability |
|---|---|---|---|
| This invention | A | 0 | ◎ |
| | | 0.02 | ◎ |
| | | 0.05 | ◎ |
| | | 0.1 | ○ |
| | | 0.2 | ○ |
| | B | 0 | ◎ |
| | | 0.02 | ◎ |
| | | 0.05 | ◎ |
| | | 0.1 | ○ |
| | | 0.2 | ○ |
| | C | 0 | ◎ |
| | | 0.02 | ◎ |
| | | 0.05 | ◎ |
| | | 0.1 | ○ |
| | | 0.2 | ○ |
| | D | 0 | ◎ |
| | | 0.02 | ◎ |
| | | 0.05 | ◎ |
| | | 0.1 | ○ |
| | | 0.2 | ○ |
| | E | 0 | ◎ |
| | | 0.02 | ◎ |
| | | 0.05 | ◎ |
| | | 0.1 | ○ |
| | | 0.2 | ○ |
| Comparative example | A | 0.3 | X |
| | B | 0.3 | X |
| | C | 0.3 | X |
| | D | 0.3 | X |
| | E | 0.3 | X |

Example 3

Ag plating was performed in the same manner as in Example 1, except that heat treatment was used as the method of removing the work affected layer of each copper alloy, and the Ag platability was evaluated using the same criteria as in Example 1.

The removal of the work affected layer of each copper alloy was performed by heat treatment of 2 hours in a heating furnace with a reducing atmosphere of hydrogen. Herein, five specimens of each copper alloy were prepared for examples of the present invention so that their individual work affected layers after the removal treatment had thicknesses of 0, 0.02, 0.05, 0.1 and 0.2 μm, respectively; while one specimen of each copper alloy was prepared for a comparative example so that its work affected layer after the removal treatment had the thickness of 0.3 μm.

Additionally, for reducing the thickness of the work affected layer of each copper alloy to 0, 0.02, 0.05, 0.1, 0.2 and 0.3 μm from the original value of 0.4 μm, the heat-treatment temperatures were set at 600, 585, 565, 540, 500 and 450° C., respectively.

Evaluation results in Example 3 are shown in Table 4.

TABLE 4

| Remarks | Alloy No. | Thickness of work affected layer (μm) | Evaluation of Ag platability |
|---|---|---|---|
| This invention | A | 0 | ◎ |
| | | 0.02 | ◎ |
| | | 0.05 | ◎ |
| | | 0.1 | ○ |
| | | 0.2 | ○ |
| | B | 0 | ◎ |
| | | 0.02 | ◎ |
| | | 0.05 | ◎ |
| | | 0.1 | ○ |
| | | 0.2 | ○ |
| | C | 0 | ◎ |
| | | 0.02 | ◎ |
| | | 0.05 | ◎ |
| | | 0.1 | ○ |
| | | 0.2 | ○ |
| | D | 0 | ◎ |
| | | 0.02 | ◎ |
| | | 0.05 | ◎ |
| | | 0.1 | ○ |
| | | 0.2 | ○ |
| | E | 0 | ◎ |
| | | 0.02 | ◎ |
| | | 0.05 | ◎ |
| | | 0.1 | ○ |
| | | 0.2 | ○ |
| Comparative example | A | 0.3 | X |
| | B | 0.3 | X |
| | C | 0.3 | X |
| | D | 0.3 | X |
| | E | 0.3 | X |

As can be seen from Table 2, Table 3 and Table 4, the projecting anomalous precipitates formed on the Ag-plated surface were few in every example of the present invention and, when the thickness of the work affected layer was thinner than or equal to 0.05 μm, the number of anomalous precipitates formed was very few and the Ag platability was particularly excellent.

Even when the copper alloys were different in alloy type or in method for removal of their work affected layers, they achieved the same results so long as their work affected layers had the same thickness. In any of those cases, it was possible to obtain excellent Ag platability by reducing the thickness of the work affected layer to 0.2 μm or below.

In every comparative example, on the other hand, the non-uniform and fine work affected layer remained on the surface of the copper alloy without being properly removed, so the anomalous precipitation ascribable to the work affected layer occurred to cause deterioration in Ag platability.

Example 4

Copper alloys having chemical compositions shown in Table 1 were made into 0.15-mm thick copper alloy sheets by undergoing casting, rolling and annealing in succession. These copper alloy sheets were each given degreasing treatment and pickling treatment, and then subjected to treatment for removal of their respective work affected layers by chemical dissolution. Each of the thus treated materials was coated with Cu plating, and Cu platability was evaluated.

The degreasing treatment was performed by cathodic electrolysis for 30 seconds in a degreasing solution, which contained 60 g/l of Cleaner 160S (trade name, produced by Meltex Inc.) and was kept at a temperature of 60° C., under a current density of 2.5 A/dm$^2$. And the pickling treatment was performed at room temperature by immersion for 30 seconds in an acid pickling solution containing 100 g/l of sulfuric acid.

Each of the work affected layers underwent removal treatment by immersion in an aqueous solution containing 100 g/l of sulfuric acid and 15 μl of hydrogen peroxide at room temperature. Herein, five specimens of each copper alloy were prepared for examples of the present invention so that their individual work affected layers after the removal treatment had different thicknesses of 0, 0.02, 0.05, 0.1 and 0.2 μm, respectively; while one specimen of each copper alloy was prepared for a comparative example so that its work affected layer after the removal treatment had the thickness of 0.3 μm.

The Cu plating was performed at a liquid temperature of 45° C. in an Cu plating bath containing 65 g/l of copper cyanide, 110 g/l of potassium cyanide and 7.5 g/l of potassium carbonate under a current density of 1.5 A/dm$^2$ until the plating thickness reached 0.1 μm.

The Cu platability of each copper alloy was evaluated by tape peel testing. After the Cu-plating, a sample was cut to a length of 30 mm and a width of 10 mm from each of the copper alloy sheets, and heated using a hot plate for 7 minutes at 350° C. in the atmosphere. On the oxide film thus formed on the sample surface, an adhesive tape (631S made by Teraoka Seisakusho Co., Ltd.) was stuck, and then peeled off. At this peeling-off, cases in which almost no exfoliation was observed were rated as "⊚", cases in which exfoliation was observed in some spots were rated as "○", and cases in which exfoliation was observed in at least one-half the total area were rated as "×".

Evaluation results in Example 4 are shown in Table 5.

TABLE 5

| Remarks | Alloy No. | Thickness of work affected layer (μm) | Evaluation of Cu platability |
|---|---|---|---|
| This invention | A | 0 | ⊚ |
| | | 0.02 | ⊚ |
| | | 0.05 | ⊚ |
| | | 0.1 | ○ |
| | | 0.2 | ○ |
| | B | 0 | ⊚ |
| | | 0.02 | ⊚ |
| | | 0.05 | ⊚ |
| | | 0.1 | ○ |
| | | 0.2 | ○ |
| | C | 0 | ⊚ |
| | | 0.02 | ⊚ |
| | | 0.05 | ⊚ |
| | | 0.1 | ○ |
| | | 0.2 | ○ |
| | D | 0 | ⊚ |
| | | 0.02 | ⊚ |
| | | 0.05 | ⊚ |
| | | 0.1 | ○ |
| | | 0.2 | ○ |
| | E | 0 | ⊚ |
| | | 0.02 | ⊚ |
| | | 0.05 | ⊚ |
| | | 0.1 | ○ |
| | | 0.2 | ○ |
| Comparative example | A | 0.3 | X |
| | B | 0.3 | X |
| | C | 0.3 | X |
| | D | 0.3 | X |
| | E | 0.3 | X |

Example 5

Cu plating was performed in the same manner as in Example 4, except that electrolytic dissolution was used as the method of removing the work affected layer of each copper alloy, and the Cu platability was evaluated using the same criteria as in Example 4.

The removal of the work affected layer of each copper alloy was performed by anodic electrolysis in an aqueous solution containing 700 g/l of phosphoric acid at room temperature under a current density of 10 A/dm$^2$. Herein, five specimens of each copper alloy were prepared for examples of the present invention so that their individual work affected layers after the removal treatment had thicknesses of 0, 0.02, 0.05, 0.1 and 0.2 μm, respectively; while one specimen of each copper alloy was prepared for a comparative example so that its work affected layer after the removal treatment had the thickness of 0.3 μm.

Evaluation results in Example 5 are shown in Table 6.

TABLE 6

| Remarks | Alloy No. | Thickness of work affected layer (μm) | Evaluation of Cu platability |
|---|---|---|---|
| This invention | A | 0 | ⊚ |
| | | 0.02 | ⊚ |
| | | 0.05 | ⊚ |
| | | 0.1 | ○ |
| | | 0.2 | ○ |
| | B | 0 | ⊚ |
| | | 0.02 | ⊚ |
| | | 0.05 | ⊚ |
| | | 0.1 | ○ |
| | | 0.2 | ○ |
| | C | 0 | ⊚ |

TABLE 6-continued

| Remarks | Alloy No. | Thickness of work affected layer (μm) | Evaluation of Cu platability |
|---|---|---|---|
| | | 0.02 | ◎ |
| | | 0.05 | ◎ |
| | | 0.1 | ○ |
| | | 0.2 | ○ |
| | D | 0 | ◎ |
| | | 0.02 | ◎ |
| | | 0.05 | ◎ |
| | | 0.1 | ○ |
| | | 0.2 | ○ |
| | E | 0 | ◎ |
| | | 0.02 | ◎ |
| | | 0.05 | ◎ |
| | | 0.1 | ○ |
| | | 0.2 | ○ |
| Comparative example | A | 0.3 | X |
| | B | 0.3 | X |
| | C | 0.3 | X |
| | D | 0.3 | X |
| | E | 0.3 | X |

Example 6

Cu plating was performed in the same manner as in Example 4, except that heat treatment was used as the method of removing the work affected layer of each copper alloy, and the Cu platability was evaluated using the same criteria as in Example 4.

The removal of the work affected layer of each copper alloy was performed by heat treatment of 2 hours in a heating furnace with a reducing atmosphere of hydrogen. Herein, five specimens of each copper alloy were prepared for examples of the present invention so that their individual work affected layers after the removal treatment had thicknesses of 0, 0.02, 0.05, 0.1 and 0.2 μm, respectively; while one specimen of each copper alloy was prepared for a comparative example so that its work affected layer after the removal treatment had the thickness of 0.3 μm.

Additionally, for reducing the thickness of the work affected layer of each copper alloy to 0, 0.02, 0.05, 0.1, 0.2 and 0.3 μm from the original value of 0.4 μm, the heat-treatment temperatures were set at 600, 585, 565, 540, 500 and 450° C., respectively.

Evaluation results in Example 6 are shown in Table 7.

TABLE 7

| Remarks | Alloy No. | Thickness of work affected layer (μm) | Evaluation of Cu platability |
|---|---|---|---|
| This invention | A | 0 | ◎ |
| | | 0.02 | ◎ |
| | | 0.05 | ◎ |
| | | 0.1 | ○ |
| | | 0.2 | ○ |
| | B | 0 | ◎ |
| | | 0.02. | ◎ |
| | | 0.05 | ◎ |
| | | 0.1 | ○ |
| | | 0.2 | ○ |
| | C | 0 | ◎ |
| | | 0.02 | ◎ |
| | | 0.05 | ◎ |
| | | 0.1 | ○ |
| | | 0.2 | ○ |
| | D | 0 | ◎ |
| | | 0.02 | ◎ |
| | | 0.05 | ◎ |
| | | 0.1 | ○ |
| | | 0.2 | ○ |
| | E | 0 | ◎ |
| | | 0.02 | ◎ |
| | | 0.05 | ◎ |
| | | 0.1 | ○ |
| | | 0.2 | ○ |
| Comparative example | A | 0.3 | X |
| | B | 0.3 | X |
| | C | 0.3 | X |
| | D | 0.3 | X |
| | E | 0.3 | X |

As can be seen from Table 5, Table 6 and Table 7, the exfoliation area of the oxidation film formed after Cu-plating was small in every example of the present invention. When the thickness of the work affected layer was thinner than or equal to 0.05 μm, the exfoliation area of the oxide film was very small and the Cu platability was particularly excellent.

Even when the copper alloys were different in alloy type or in method for removal of their work affected layers, they achieved the same results so long as their work affected layers had the same thickness. In any of those cases, it was possible to obtain excellent Cu platability by reducing the thickness of the work affected layer to 0.2 μm or below.

In every comparative example, on the other hand, the non-uniform and fine work affected layer remained on the surface of the copper alloy without being properly removed, so the anomalous precipitation ascribable to the work affected layer occurred to cause deterioration in the Cu platability.

INDUSTRIAL APPLICABILITY

The copper alloy of the present invention is excellent in platability. Therefore, the copper alloy is suitable for use in, for example, parts of electronic machinery and tools, such as semiconductor lead frames, terminals and connectors.

Having described our invention as related to the present embodiments, it is our intention that the invention not be limited by any of the details of the description, unless otherwise specified, but rather be construed broadly within its spirit and scope as set out in the accompanying claims.

What is claimed is:

1. A method of producing a precipitate-type copper alloy material for electronic machinery and tools,
wherein the precipitate-type copper alloy material consisting essentially of 2.0 to 4.0% by mass of Ni and 0.4 to 0.8% by mass of Si, and either (a) 0.05 to 0.3% by mass of Mg or (b) 0.005 to 2.0% by mass in a total amount of at least one selected from the group consisting of 0.005 to 0.2% by mass of Ag, 0.005 to 0.2% by mass of Mn and 0.05 to 1.0% by mass of Zn, with the balance being Cu and inevitable impurities, and has a work affected layer in a surface layer thereof,
the producing method comprising the steps of:
casting the precipitate-type copper alloy material;
rolling the precipitate-type copper alloy material;
optionally buff polishing the precipitate-type copper alloy material;
annealing the precipitate type copper alloy material;
optionally degreasing the precipitate-type copper alloy material;
optionally pickling the precipitate-type copper alloy material by washing in an acid;
subjecting the work affected layer in the surface layer to a heat treatment at a temperature of 500 to 585° C. in a non-oxidizing atmosphere or a reducing atmosphere, thereby to make the work affected layer have a thickness of 0.2 μm to 0.02 μm, to repair crystallinity of the surface layer; and subjecting the heat-treated copper alloy material to plating with Ag or Cu, wherein the plating is in direct contact with at least a portion of the work affected layer whose crystallinity is repaired via the heat treatment.

2. The producing method according to claim 1, wherein the work affected layer in the surface layer is subjected to a heat treatment at a temperature of 565 to 585° C. in the non-oxidizing atmosphere or the reducing atmosphere, thereby to make the work affected layer have a thickness of 0.05 μm to 0.02 μm to repair crystallinity of the surface layer.

3. The producing method according to claim 1, wherein the heat treatment is conducted for 2 hours.

4. A method of producing a precipitate-type copper alloy material for electronic machinery and tools, wherein the precipitate-type copper alloy material consisting essentially of 2.0 to 4.0% by mass of Ni and 0.4 to 0.8% by mass of Si, and either (a) 0.05 to 0.3% by mass of Mg or (b) 0.005 to 2.0% by mass in a total amount of at least one selected from the group consisting of 0.005 to 0.2% by mass of Ag, 0.005 to 0.2% by mass of Mn and 0.05 to 1.0% by mass of Zn, with the balance being Cu and inevitable impurities, and has a work affected layer in a surface layer thereof, the producing method comprising the steps of:
casting the precipitate-type copper alloy material;
rolling the precipitate-type copper alloy material;
buff polishing the precipitate-type copper alloy material;
annealing the precipitate type copper alloy material;
optionally degreasing the precipitate-type copper alloy material;
optionally pickling the precipitate-type copper alloy material by washing in an acid;
subjecting the work affected layer in the surface layer to a heat treatment at a temperature of 500 to 585° C. in a non-oxidizing atmosphere or a reducing atmosphere, thereby to make the work affected layer have a thickness of 0.2 μm to 0.02 μm, to repair crystallinity of the surface layer; and
subjecting the heat-treated copper alloy material to plating with Ag or Cu,
wherein the plating is in direct contact with at least a portion of the work affected layer whose crystallinity is repaired via the heat treatment.

5. The producing method according to claim 4, wherein the work affected layer in the surface layer is subjected to a heat treatment at a temperature of 565 to 585° C. in the non-oxidizing atmosphere or the reducing atmosphere, thereby to make the work affected layer have a thickness of 0.05 μm to 0.02 μm to repair crystallinity of the surface layer.

6. The producing method according to claim 4, wherein the heat treatment is conducted for 2 hours.

* * * * *